United States Patent
Taylor

[11] 3,995,311
[45] Nov. 30, 1976

[54] OPTICAL LOGIC ELEMENTS
[75] Inventor: Henry F. Taylor, San Diego, Calif.
[73] Assignee: The United States of America as represented by the Secretary of the Navy, Washington, D.C.
[22] Filed: Sept. 22, 1975
[21] Appl. No.: 615,311

[52] U.S. Cl. .......................... 350/96 C; 350/96 WG
[51] Int. Cl.² .......................................... G02B 5/14
[58] Field of Search .................... 350/96 C, 96 WG

[56] References Cited
UNITED STATES PATENTS
3,909,108   9/1975   Taylor .............................. 350/96 C OTHER PUBLICATIONS
Taylor, "Optical–Waveguide connecting Networks" Electronics Letters, vol. 10, No. 4, pp. 41–43, Feb. 1974.

Primary Examiner—John K. Corbin
Assistant Examiner—Stewart Levy
Attorney, Agent, or Firm—R. S. Sciascia; G. J. Rubens; J. W. McLaren

[57] ABSTRACT

Two light paths are disposed to induce resonant coupling of light energy from one path to the other. Electrodes connected to an electrical source are positioned relative to the two light paths and to develop electric fields which inhibit the resonant coupling from one light path to the other. A photoconductive region is positioned in one of the two light paths or in an additional third light path so that transmission of light energy through the photoconductive material produces a lowered resistance path between the electrodes, substantially diminishing the potential across the electrodes, and causing commensurate diminution of the electric fields so that resonant coupling is inhibited between the resonantly coupled optical paths. Three light paths may be employed to provide an optical AND gate while two light paths can be arranged to provide an optical OR gate.

8 Claims, 8 Drawing Figures

U.S. Patent  Nov. 30, 1976  Sheet 2 of 2  3,995,311
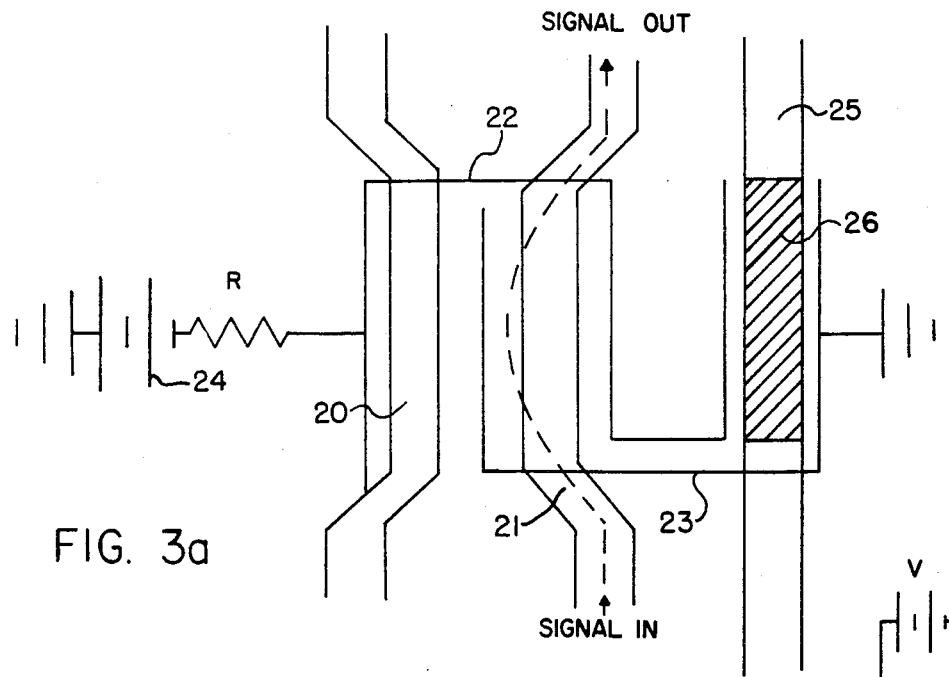
FIG. 3a
FIG. 3b
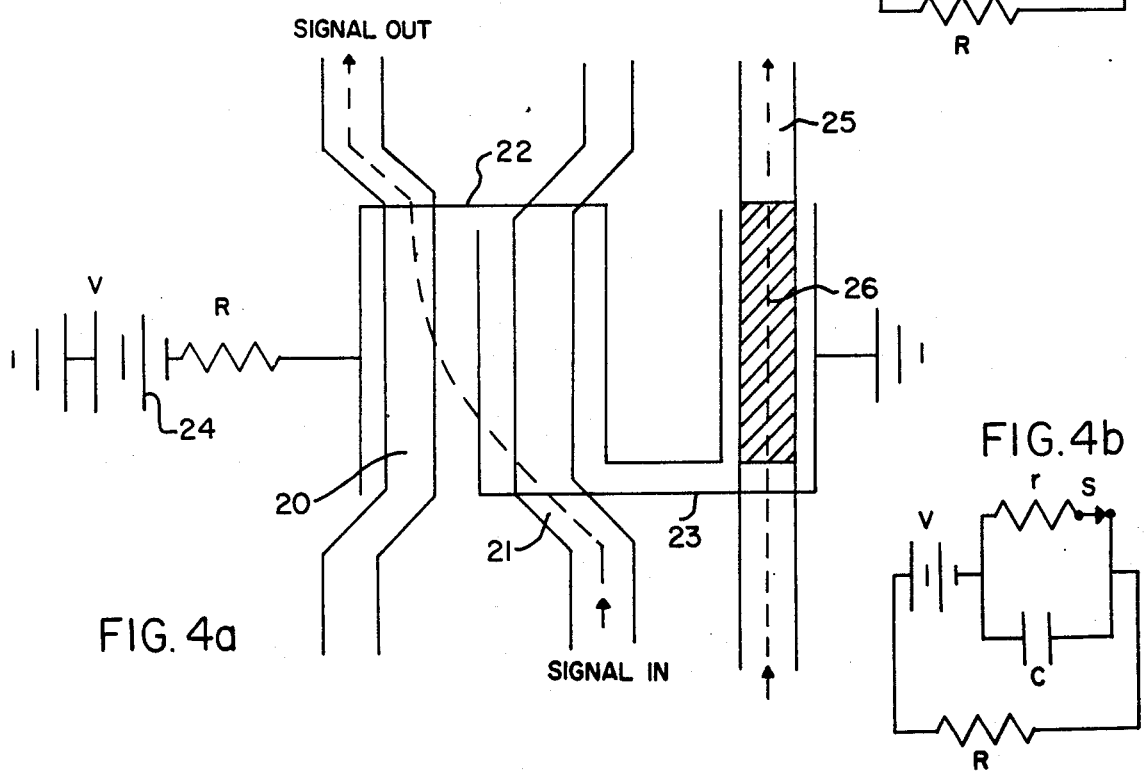
FIG. 4a
FIG. 4b

OPTICAL LOGIC ELEMENTS

BACKGROUND OF THE INVENTION

The use of electronic components and elements such as transistors and integrated circuitry, for example, to form logic operations is well known in the prior art. One of the more common examples of such prior art practices is exemplified by present day digital computers which are largely comprised of many interconnected electronic logic elements.

Unfortunately, however, electronic logic elements are limited in their performance to typical speeds of 5 to 10 nanoseconds per operation. Furthermore, electronic logic elements such as employed in electronic data processing and electronic computer systems do not directly interface with optical information processing and communications systems. Therefore, in a typical system interface involving both electronic and optical techniques, the light energy must be detected and converted to electrical energy of commensurate signal information, the logic operations must then be performed electronically, and that procedure followed by reconversion of the electrical signals to light energy signals.

Accordingly, from the standpoint of performance, reliability, and cost considerations in the fabrication of optical communications and processing systems it is highly desirable that logic operations and functions be completed directly on light energy signals, such as light beams, obviating the disadvantages of prior art practices which necessitated conversion of light energy signals into commensurate electrical signals and then, after completion of the logic operations, reconversion of the rsultant electronic signals back into the form of light energy signals.

SUMMARY OF THE INVENTION

A number of logic operations such as those of AND and OR gates, for example, require that a non-linear interaction take place between information carriers. In accordance with the concept of the present invention, the information carriers are two light beams and the non-linear interaction results from electro-optic and photoconductive effects in a suitable semiconducting material.

A fundamental requirement of the logic elements of the present invention, such as AND and/or OR gates which function entirely in an optical manner in their operation, is an electro-optic waveguide switch. The electro-optic waveguide switch consists of two contiguous parallel dielectric optical waveguides in a suitable electro-optic material which are disposed and arranged so that resonant coupling takes place between them, transferring light energy propagating along one of the optical waveguides into the other optical waveguide.

Electrodes are disposed contiguous to the two optical waveguides for common connection to an electrical potential of such polarity as to generate electric fields of opposite sense across the optical waveguides. The presence of the electric fields operates upon the electro-optic waveguide material to inhibit resonant coupling between the two optical waveguides and therefore prevents the transfer of light energy from one optical waveguide to another.

Additionally, a photoconductive region is positioned in a light path (which may or may not be one of the two optical waveguides) so that upon transmission of light energy through the photoconductive region, it exhibits lowered resistance. The photoconductive region is arranged relative to the two electrodes so that it is capable of producing a lowered electrical resistance path between the electrodes. The lower resistance path between the electrodes substantially diminishes the potential across the electrodes, causing a commensurate diminution of the strength of the electric fields to a degree which permits resonant coupling of light energy between the first and second optical waveguides.

The concept of the present invention may be embodied in an optical OR logic gate that comprises first and second optical waveguides which are spatially disposed to produce the previously described resonant coupling of light energy therebetween. The electrodes are disposed contiguous to the first and second optical waveguides for common connection to a suitable source of electrical potential of a polarity to generate electric fields of opposite sense and thereby inhibit resonant coupling between the two waveguides. A photoconductive region in one of the two optical waveguides is responsive to the transmission of light energy therethrough for producing the previously described lowered resistance path between electrodes, substantially diminishing the potential across the electrodes, and causing commensurate diminution of the electric fields thereby permitting resonant coupling of light energy between the first and second optical waveguides.

Accordingly, if the photoconductive region is in the second optical waveguide light energy will emerge from the first optical waveguide if light energy enters either the first optical waveguide or the second optical waveguide, fulfilling the requisites of an OR logic gate.

When, for example, light energy enters the first optical waveguide, the electric fields which exist across the optical waveguides prevents transference of that light energy from the first optical waveguide to the second optical waveguide; consequently, the light energy will both enter and emerge from the first optical waveguide without being disturbed.

The OR logic function is completed by reason of the fact that light energy entering the second optical waveguide will activate the photoconductive region therein, significantly reducing the resistance path between the electrodes, thereby removing the inhibition of resonant optical coupling between the two optical waveguides so that at least a portion of the light energy propagating in the second optical waveguide is resonantly coupled into the first optical waveguide and will emerge from the first optical waveguide.

Therefore, the arrangement as fabricated and conceived by the present invention provides for operation in the manner of an optical OR logic gate, since light energy propagated along either the first optical waveguide or the second optical waveguide will produce emerging light energy from the first optical waveguide.

The concept of the present invention may also be embodied in an optical AND logic gate. In such an embodiment the first and second optical waveguides will operate substantially in the manner previously described, in the sense that they are disposed so as to be resonantly coupled for the transfer of light energy from one optical waveguide to the other. However, in the embodiment of the present invention as an optical AND gate the photoconductive region is disposed in a third light path, rather than in one of the two resonantly coupled optical waveguides.

Accordingly, light transmitted along the second optical waveguide will not be transferred out of the second optical waveguide into the first optical waveguide in the absence of a second signal to activate the photoconductive region in the third optical path. However, when light energy is propagated along the third optical path as well as the second optical waveguide, the photoconductive region arranged relative to the electrodes so as to produce a significantly diminished resistance path upon activation, will substantially diminish the potential across the electrodes, causing commensurate diminution of the electric fields across the first and second optical waveguides and thereby permitting resonant coupling of light energy between the first and second optical waveguides.

Consequently, under the described conditions where light energy is received in both the second optical waveguide and the third optical path, light will emerge from the first optical waveguide. But, in the absence of light energy simultaneous propagated in both the second optical waveguide and the third optical path, no light will emerge from the first optical waveguide. Therefore, the latter described embodiment of the present invention is functionally operative as an optical AND logic gate.

Accordingly, it is a primary object of the present invention to provide logic elements which are completely compatible with optical systems such as communication and data processing systems.

A concomitant primary object of the present invention is to provide logic elements which operate wholly upon optical carriers such as light beams.

An equally important object of the present invention is to provide logic elements which may be directly interfaced with optical communication and data processing systems, obviating the need for transducing energy from one form to another.

A further object and advantage of the present invention is to provide an extremely high speed logic elements which are capable of operation within one nanosecond or less.

Another important object of the present invention is to provide an optical logic element which may be embodied to perform AND logic functions, and OR logic functions.

These and other features, objects, and advantages of the present invention will be better appreciated from an understanding of the operative principles of a preferred embodiment as described hereinafter and as illustrated in the accompanying drawings.

BRIEF DESCRIPTION OF THE DRAWINGS

In the drawings:

FIGS. 3a and 4a are illustrations of an AND gate embodiment of the present invention in two different conditions of operation; and FIGS. 3b and 4b are schematic illustrations of the equivalent electrical circuits corresponding to the two different conditions of operation of the embodiments illustrated in FIGS. 3a and 4a, respectively.

DESCRIPTION OF THE PREFERRED EMBODIMENTS

Figure 1A:
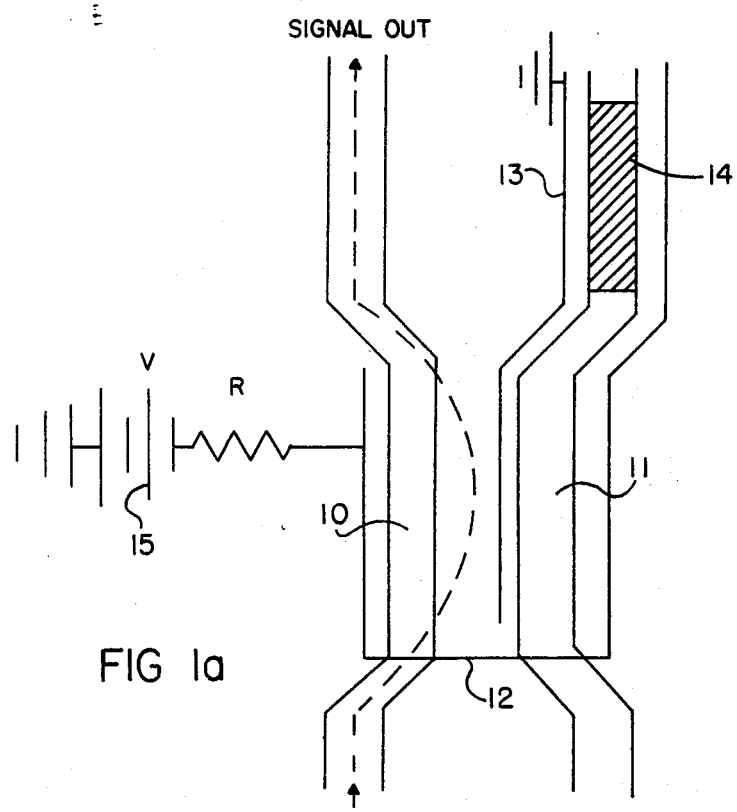
FIGS. 1a and 2a are illustrations of an OR gate embodiment of the present invention under two different conditions of operation.
Figure 2A:
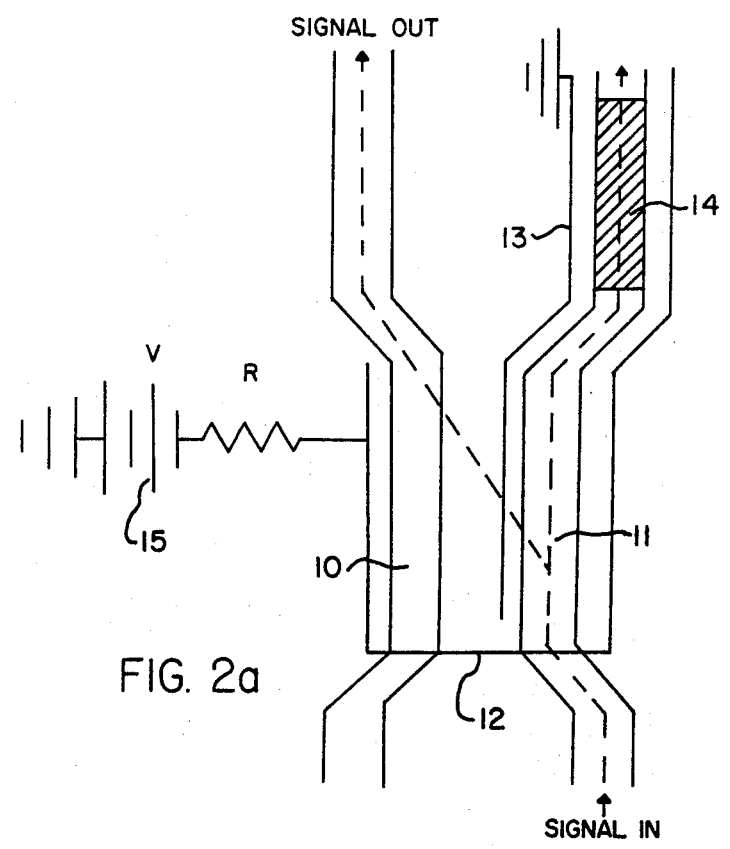

FIGS. 1a and 2a illustrate an OR gate embodiment of the present invention in its two different states of operation. In FIG. 1a and FIG. 2a like elements are identified by the same numerical designations.

First and second optical waveguides 10 and 11 have parallel contiguous portions which are disposed to induce resonant coupling of light propagated along one of the optical waveguides into the other optical waveguide. Electrodes 12 and 13 disposed contiguous to the first and second optical waveguides so that they will generate electric fields of opposite sense across the first and second optical waveguides 10 and 11 to inhibit resonant optical coupling therebetween when the electrodes are connected to a suitable source of electrical potential.

The second optical waveguide 11 includes a photoconductive region 14 of suitable material which is responsive to light energy to significantly reduce its electrical resistivity.

As indicated in FIG. 1a, a condition of operation of the logic OR gate of the present invention is illustrated in which there is light energy transmitted only along the first optical waveguide 10. Since the electrodes 12 and 13 are connected to a source of electrical potential 15, electrical fields of opposite sense are developed across the first and second optical waveguides 10 and 11, inhibiting resonant optical coupling between them. Therefore, the optical energy propagating along the first optical waveguide 10 is inhibited from being resonantly coupled into the second optical waveguide 11 and emerges from the first optical waveguide as is schematically illustrated by the dash lines.

Figure 1B:
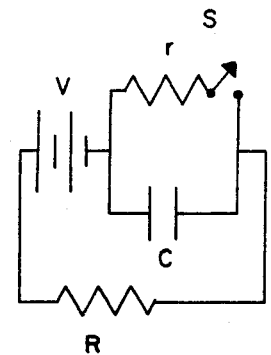
FIGS. 1b and 2b are schematic representations of the electrically equivalent circuits corresponding to the conditions of operation of the OR gate illustrated in FIGS. 1a and 2a, respectively.

FIG. 1b represents the equivalent electrical circuit which illustrates the potential source V connected in series with the resistance R, developing a potential across the electrodes 12 and 13 in the form of a capacitive charge C because of the open circuit conditions as represented by the open switch S.

A second state of operation is illustrated in FIG. 2a where it is seen that light energy entering and propagated along the second optical waveguide 11 activates the photoconductive region 14, providing a relatively low resistance path between the electrodes 12 and 13, thereby diminishing the potential developed across the electrodes 12 and 13, causing a commensurate diminution of the electric fields across the resonantly coupled optical waveguides 10 and 11. Accordingly, a portion, at least, of the optical energy propagating in the second optical waveguide 11 is resonantly coupled into the optical waveguide 10 and emerges therefrom as indicated schematically by the dash lines.

Figure 2B:
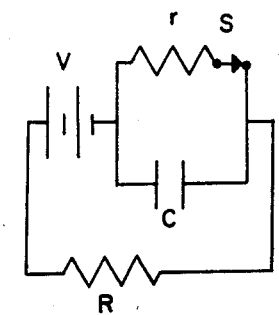

The equivalent electrical circuit is illustrated in FIG. 2b where, in contrast to the conditions illustrated in the equivalent electrical circuit of FIG. 1b, the switch S is shown to be closed representing the activation of the photoconductive region 14 creating a relatively very low resistance path r between the two electrodes 12 and 13, thereby significantly reducing the potential developed across the electrodes and electric fields generated across the optically resonantly coupled optical waveguides 10 and 11.

Accordingly, if a light energy signal is present in waveguide 10, or in optical waveguide 11, or both, a light energy signal will emerge from optical waveguide 10.

Therefore, the device illustrated in FIGS. 1a and 2a functions as an OR logic element with the output of waveguide 10 conforming to the following truth table

TABLE A

| 11 \ 10 | 0 | 1 |
|---|---|---|
| 0 | 0 | 1 |
| 1 | 1 | 1 |

FIG. 3a is an illustration of an embodiment of the present invention which functions as an optical AND logic gate. Waveguides 20 and 21 are arranged to be resonantly coupled essentially in the same manner as previously described with respect to waveguides 10 and 11 of FIG. 1a. Electrodes 22 and 23 are disposed to generate electric fields of opposite sense across optical waveguides 20 and 21 upon connection to a suitable electrical potential such as the battery 24.

The AND gate embodiment of the present invention as illustrated in FIG. 3a includes, it will be noted, a third optical path which may take the form of an optical waveguide 25. The optical waveguide 25 includes a photoconductive region 26 of suitable material which is responsive to the transmission of light energy therethrough to provide a significantly reduced electrically resistive path. Accordingly, since the electrodes 22 and 23 are disposed contiguous to the photoconductive region 26, the transmission of light energy along optical waveguide 25 will provide a substantially reduced resistive path across the electrodes 22 and 23.

In the state of operation illustrated in FIG. 3a, however, a light energy signal is schematically indicated by the dash lines to be transmitted along the optical waveguide 21, and that light energy is not coupled into the optical waveguide 20 because of the presence of the electric fields generated by the electrodes 22 and 23, inhibiting resonant optical coupling which would otherwise be present.

FIG. 3b illustrates the equivalent electrical circuit showing that the switch S, representative of the photoconductive region 26, is open providing a relatively very high resistive path in the form of an open circuit comprising essentially the capacitive charge across the two electrodes 22 and 23 as represented by C in FIG. 3b.

However, when a light energy signal is present in waveguide 25 as well as in waveguide 21, a different operation takes place as is illustrated in FIG. 4a. The light energy transmitted along waveguide 25 will activate the photoconductive region 26 so as to provide a relatively much lower resistive path between the electrodes 22 and 23 thereby substantially reducing the potential generated across the electrodes 22 and 23 with a commensurate diminution of the electric fields across the electrodes. In the state of reduced electric fields, resonant optical coupling between the waveguides 20 and 21 is no longer inhibited and at least a portion of the light energy transmitted along the optical waveguide 21 is resonantly coupled into the optical waveguide 20. Accordingly, when signals are present in both optical waveguide 21 and 25, an output signal will emerge from optical waveguide 20.

The equivalent electrical circuit is shown in FIG. 4b where the switch S is shown to be closed, indicating activation of the photoconductive region 26 providing a significantly lowered resistive path r which shunts the essentially open circuit of capacitive charge C. The potential developed across the electrodes 22 and 23 is therefore reduced, resulting in a commensurate diminution of the electric fields generated across the electrodes 22 and 23. Consequently, at least a portion of the light energy signals propagating along optical waveguide 21 are optically coupled into optical waveguide 20, since resonant optical coupling between the two optical waveguides 20 and 21 is no longer completely inhibited.

Accordingly, it may be readily appreciated that if a signal is absent from either waveguide 21 or optical waveguide 25, no signal will emerge from optical waveguide 20. Therefor, the embodiment of the present invention as illustrated in FIGS. 3a and 4a satisfies the requirements of an AND optical logic element by the output of waveguide 20 in accordance with the AND truth table

TABLE B

| 21 \ 25 | 0 | 1 |
|---|---|---|
| 0 | 0 | 0 |
| 1 | 0 | 1 |

Those skilled and knowledgeable in the pertinent arts will readily appreciate that the concept and teaching of the present invention may be embodied in optical elements fabricated by known techniques employing the established properties of suitable materials.

For example, devices such as illustrated in the embodiments disclosed herein may be fabricated of CdS or ZnSe in which low-loss waveguides and modulators have previously been fabricated using solid state diffusion techniques.

In the employment of such techniques an $SiO_2$ mask is deposited on a polished substrate of suitable single crystal material; then the $SiO_2$ is covered with a photoresist material or electron resist material. The resist material is exposed to light or an electron beam, as the case may be, and then developed so that the $SiO_2$ may be selectively etched away. The remaining resist material is removed, and the substrate is then sealed with a suitable diffusant, such as Cd, in an ampule and heated. This step of the process causes a mixed crystal, i.e., $Zn_{1-x}Cd_xSe$, to be produced in the region which is not covered by the $SiO_2$. The mixed crystal has a higher refractive index than the pure substrate so that it performs in the manner of a dielectric optical waveguide. Electrodes may then be deposited on the surface of the substrate in any desired pattern, such as those illustrated in the embodiments disclosed herein.

The photoconductive region for the AND and OR gates may be produced by a second diffusion in which the entire substrate is masked, except for the waveguide region which it is desired to render photoconductive. The diffusant may be an impurity with absorption within the band gap or a material such as Cd to further lower the band gap in the region which it is desired to render photoconductive. For example, the band gap of $Zn_{1-x}Cd_xSe$ decreases with increasing $x$, so that the diffusion can produce a large value of $x$; that is, $x > 0.5$.

Examples of other materials suitable to use in fabrication of the present invention include the substrates $LiNbO_3$ and $LiTaO_3$, with diffusants such as Cu, Ni, or Ti.

The external resistor R may also be conveniently fabricated on the same substrate by providing a precalculated distance between the two electrodes which establishes a high-resistivity path in the material of the substrate.

The time response of a device fabricated in accordance with the concept and teaching of the present invention is determined by the values of r and R. The time required for a logical AND/OR operation would be approximately rc and the time for recovery approximately RC, assuming that R is much much greater than r in accordance with the teaching of the present invention.

Some of the more important design parameters for optical logical elements fabricated in accordance with the concept and teaching of the present invention include optical power required, speed of operation, electrical current and voltage required, the size of each logic element, and heat dissipation. These parameters, as will be readily apparent to those skilled and adept in the pertinent arts, are intimately related to the properties of the particular materials selected for use in each different embodiment.

For example, the dark resistance $R_D$ may be expressed approximately as $$R_D \approx \frac{\rho_D l}{WL} \tag{1}$$

where W is an effective depth of current penetration ($W \approx l$ if the substrate thickness $> l$), $l$ is the electrode separation, L is the length of the electrode structure and $\rho_D$ is the dark resistivity.

The resistance of the photoconductive element in the presence of light, $r$, may be calculated if it is assumed that the photoconductive current penetrates the material only to a depth $t$, comparable to the transverse waveguide dimensions. The conduction current I may then be expressed as $$I = nevtL \tag{2}$$

where $n$ is the volume carrier concentration, $e$ is the electronic charge, and $v$ is the carrier velocity. This latter quantity can be expressed in terms of the carrier mobility $\mu$ and applied voltage V as $$v = \mu V/l \tag{3}$$

The carrier concentration is related to the carrier lifetime $\tau$, optical power P, and photon energy $h\nu$ by the expression $$n = \frac{P\tau}{lLt(h\nu)} \tag{4}$$

This assumes that one mobile carrier is produced per photon absorbed. Substituting (3) and (4) into (2) gives $$I = \frac{eV\tau P}{l(h\nu)} \tag{5}$$

It follows that the resistance is $$r = \frac{l^2(h\nu)}{Pe\mu\tau} \tag{6}$$

Another important parameter is the electrode capacitance. The capacitance of a typical electrode structure, if the electrodes are each of width $l$, is $$C \approx (\epsilon_o - \epsilon_s) L, \tag{7}$$

where $\epsilon_o$ and $\epsilon_s$ are the permittivities of free space and of the substrate, respectively. The switching time $T_s$ is that required to discharge the electrode capacitance, i.e., $$T_s \approx rC \tag{8}$$

and the recovery time $T_R$ is $$T_R \approx R_L C$$

assuming $R_D >> R_L >> r$

A final parameter of importance is the electric-optic coefficient. The change in refractive index $\Delta n$ induced in a material of refractive index n by an applied voltage V is $$\Delta n = n^3 \hat{r} \left(\frac{V}{l}\right)$$

The device length L is related to $\Delta n$ by $$\frac{\Delta n L}{\lambda} \approx \frac{1}{2}$$

The required voltage can thus be written $$V = \frac{1}{2} \frac{l\lambda}{Ln^3 \hat{r}} \tag{9}$$

and the electrical power W per logic element required to operate the device, and which is dissipated in the material, is $$W \approx \tfrac{1}{2} CV^2 B \tag{10}$$

where $$B = 1/T_R$$

is the number of logic operations per second.

The above relationships can be used to estimate performance parameters for a particular material. Choosing ZnSe for example, it is calculated $\mu \approx 500$ cm$^2$/ V-s $\epsilon_s \approx 8.7$ , $n = 2.66$ $\hat{r} = 2.0 \times 10^{-10}$ cm/V For 4800 Å Ar laser light $h\nu e = 2.5\ eV$ Other device parameters are chosen as follows:

$L = 0.1$ cm $l = 5 \times 10^{-4}$ cm $t = 2 \times 10^{-4}$ cm $\rho_D = 10^8 \Omega\text{-cm}$ $\tau = 10^{-8} x$ It may then be calculated $R_D = 10^{-8} \Omega$ $C = 8.6 \times 10^{-14} f$ from (1) and (7). The optical power required for switching in $10^{-8}$s is calculated from (6) and (8) to be $P = 1.1 \times 10^{-6}$ watts. It may further be determined from (9) that $V = 31$ volts and $V/l = 6.3 \times 10^4$ V/cm. The electrical power is calculated from (10) to be $W \approx 4.3 \times 10^{-4}$ watts assuming
$B = 10^8/s$ or $W/B = 4.3$ pj Accordingly, it may be seen that optical logic elements having speed and electrical power requirements which are at least comparable to those of present electronic logic elements are entirely feasible within presently known technology employing well known materials which exhibit the desired response and effects.

Moreover, such optical logic elements are highly desirable for use in optical communication and information processing systems where optical-optical interface is much more desirable than the relatively cumbersome and round-about techniques involved in the employment of optical-electrical interfaces which were customarily employed in prior art techniques.

Additionally, the concept of the present invention conceives that the photoconductive region which intercepts propagated light to cause a resultant change in the electric fields that otherwise inhibit resonant coupling, may be of suitable photoemissive material as well as photoconductive material. In the use of photoemissive or photoelectric material, radiant light energy transmitted through the photo responsive region causes an electron emission rather than a change of resistivity as is the case in the use of photoconductive material.

Thus, the highly desirable advantages of extremely high speed operation, of the order of one nanosecond or less, and total compatibility with optical communication and processing systems has been achieved by the present invention, as well as the additional feature of being readily adaptable to fabrication in extremely small unitized elements by the employment of well known proven techniques which are presently in use in the optical-electronic arts.

Obviously many modifications and variations of the present invention are possible in the light of the above teachings. It is therefore to be understood that within the scope of the appended claims the invention may be practiced otherwise than as specifically described.

What is claimed is:

1. An optical OR logic gate comprising: first and second optical waveguides spatially disposed to produce resonant coupling of light energy therebetween;
electrodes disposed contiguous to said first and second optical waveguides for common connection to an electrical potential of polarity generating electric fields of opposite sense to inhibit said resonant coupling;
an electrical potential connected in circuit with said electrodes; and
a photo responsive region in one of said optical waveguides responsive to the transmission of light energy therethrough for substantially diminishing the potential thereacross, causing commensurate diminution of said electric fields, and permitting resonant coupling of light energy between said first and second optical waveguides.

2. An optical AND logic gate comprising:
first and second optical waveguides spatially disposed to produce resonant coupling of light energy therebetween;
electrodes disposed contiguous to said first and second optical waveguides for common connection to an electrical potential of polarity generating electric fields of opposite sense across said waveguides to inhibit said resonant coupling;
an electrical potential connected in circuit with said electrodes;
a third optical path; and
a photo responsive region in said third optical path responsive to the transmission of light energy therethrough for substantially diminishing the potential thereacross, causing commensurate diminution of said electric fields, and permitting resonant coupling of light energy between said first and second optical waveguides.

3. An optical logic element comprising:
a plurality of light paths including at least two optical waveguides disposed to produce resonant coupling of light energy therebetween;
electrodes disposed contiguous to said two optical waveguides for common connection to an electrical potential of polarity generating electric fields of opposite sense across said waveguides to inhibit said resonant coupling;
an electric potential connected in circuit with said electrodes; and
a photo responsive region in one of said light paths responsive to the transmission of light energy therethrough for substantially diminishing the potential thereacross, causing commensurate diminution of said electric fields, and permitting resonant coupling of light energy between said first and second optical waveguides.

4. An optical logic element as claimed in claim 3 wherein said optical waveguides are comprised of semiconductor material.

5. An optical logic element as claimed in claim 3 wherein said optical waveguides comprise two parallel dielectric waveguides in an electro-optic material.

6. An optical logic element as claimed in claim 3 wherein said optical waveguides are comprised of ferroelectric material.

7. An optical logic element as claimed in claim 3 wherein said photo responsive region is a photoconductive material.

8. An optical logic element as claimed in claim 3 wherein said photo responsive region is a photoemissive material.

* * * * *